United States Patent [19]

Tsang

[11] Patent Number: 4,512,022
[45] Date of Patent: Apr. 16, 1985

[54] SEMICONDUCTOR LASER HAVING GRADED INDEX WAVEGUIDE

[75] Inventor: Won-Tien Tsang, New Providence, N.J.

[73] Assignee: AT&T Bell Laboratories, Murray Hill, N.J.

[21] Appl. No.: 397,809

[22] Filed: Jul. 13, 1982

[51] Int. Cl.³ .............................................. H01S 3/19
[52] U.S. Cl. ...................................... 372;45; 357/17; 357/90
[58] Field of Search ...................... 357/16, 17, 61, 90; 372/45, 44, 43, 46

[56] References Cited

U.S. PATENT DOCUMENTS 3,911,376  10/1975  Thompson ..................... 331/94.5 H
4,152,044  5/1979   Liu ................................... 350/96.12
4,328,469  5/1982   Scifres et al. ........................ 372/45

OTHER PUBLICATIONS

Tsang, "A New Current-Injection Heterostructure Laser: The Double-Barrier-Double-Heterostructure Laser", *APL* 38(11), Jun. 1, 1981, pp. 635-637.

R. F. Kazarinov and G. V. Tsarenkov, "Theory of a Variable Gap Laser," *Soviet Physics Semiconductors*, vol. 10, No. 2, (1976), pp. 178-182.

*Primary Examiner*—James W. Davie
*Attorney, Agent, or Firm*—Richard D. Laumann

[57] ABSTRACT

A semiconductor laser having a graded index waveguide layer has low current thresholds.

10 Claims, 4 Drawing Figures

SEMICONDUCTOR LASER HAVING GRADED INDEX WAVEGUIDE

TECHNICAL FIELD

This invention relates generally to semiconductor lasers and particularly to such lasers having graded index waveguides.

BACKGROUND OF THE INVENTION

Semiconductor devices are currently of interest for many applications including light sources for optical communications systems. Such systems, as presently contemplated, use glass transmission lines, commonly termed optical fibers, to optically couple a light source and photodetector. The preferred light source at the present time is a heterostructure semiconductor laser. A laser of this type comprises an active layer, i.e., a region where radiative recombination of electrons and holes occurs which is located between two cladding layers. The latter two layers provide carrier and optical field confinement.

Although many parameters are of interest in evaluating heterostructure lasers for optical communications purposes, one parameter of special interest is the current threshold, that is, the current density at which the semiconductor device begins to emit coherent electromagnetic radiation. It is generally desired that the current threshold be as low as possible to minimize, for example, ohmic heating in the device and power consumption, and to enable the laser to operate at high ambient temperatures.

Accordingly, structures have been devised with the intent of decreasing the current threshold. For example, a three layer double heterostructure laser having a GaAs active layer between $Al_xGa_{1-x}As$ cladding layers can have a very high Al concentration in the cladding layers, typically $x=0.6$ and an active layer which is very thin, typically between 500 Angstroms and 1000 Angstroms. The large compositional change causes a large refractive index discontinuity between the active and cladding layers. This results in a greater amount of the optical field being confined to the active layer and as a consequence, there is a larger overlap between the optical field and the carriers. This increased interaction between the optical radiation and the carriers reduces the current threshold.

Another approach is described in U.S. Pat. No. 3,911,376 issued on Sep. 12, 1972 to Izuo Hayashi. The semiconductor device described has a narrow bandgap, for example, a GaAs active layer between two wider bandgap, for example, AlGaAs layers and additional, for example, AlGaAs layers with an intermediate bandgap between the active layer and the cladding layers. The additional layers form an optical waveguide which increases the amount of optical field energy in the active layer. As the optical confinement is increased, the current threshold decreases. The bandgaps, which are determined by the aluminum concentrations for AlGaAs layers, are selected to ensure carrier confinement in the active layer and to keep as much as possible of the optical field energy in the layers between the cladding layers. This structure, which is commonly termed a separate confinement heterostructure, thus has two pairs of heterojunctions with the inner pair providing carrier confinement and the outer pair providing optical confinement with each layer having uniform AlAs compositions. However, the optical confinement is significantly increased only for thin active layers, i.e., for layers having a thickness less than $\lambda$ where $\lambda$ is the wavelength of the radiation as measured in the semiconductor body.

Another semiconductor device potentially of interest for optical communications systems is the AlGaAs graded index waveguide described in U.S. Pat. No. 4,152,044 issued on May 1, 1979. The structure disclosed has a single graded refractive index layer adjacent the active layer and the graded index layer forms an optical waveguide. The resulting structure is asymmetric with respect to the active layer. Due to the asymmetry, the optical field is not effectively coupled to the carriers in the active layer. Hence, no reduction in threshold is obtained. However, the waveguide layer may be used to either narrow the beam of emitted light and thereby increase coupling efficiency between the light source and an optical fiber or to guide, in an integrated optical device, light between a light source and photodetector with the light source and photodetector being formed on a common substrate.

SUMMARY OF THE INVENTION

I have found that a semiconductor device comprising a first layer having a first bandgap and second and third semiconductor layers having bandgaps greater than said first bandgap, said first layer being between said second and third layers, and said second and third layers being compositionally graded to vary their refractive indices to produce waveguiding, has a low current threshold. In one embodiment, the second and third layers have a first and second conductivity type, respectively. The second and third layers each have a maximum and minimum refractive index with the maximum being nearer the first layer than is the minimum. The device may further comprise fourth and fifth semiconductor layrs adjacent the second and third layers, respectively, and having first and second conductivity types, respectively. The second and third layers may have different conductivity types as above or both may have the same conductivity type but with low impurity concentration, generally less than $10^{17}/cm^3$. In a preferred embodiment, the refractive index profile is given by a power law which is: $n(r) = n_y[1-2(2r/w)^g \Delta]^{\frac{1}{2}}$, where r is the distance center of the waveguide, g is the exponent of the power law $\Delta \approx (n_y - n_z)/n_y$, and $n_y$ and $n_z$ are the maximum and minimum values of refractive index of the graded layers. In a further preferred embodiment, the layers comprise Group III–V compound semiconductors.

DETAILED DESCRIPTION

Figure 1:
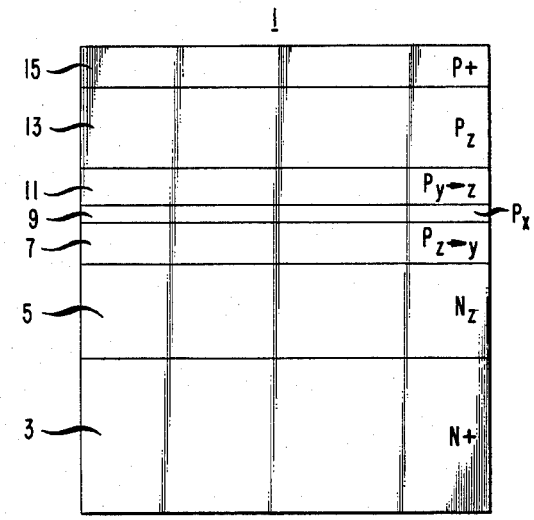
FIG. 1 is a sectional view of a device according to this invention.

A cross-sectional view of a device according to my invention is depicted in FIG. 1. For reasons of clarity, the elements of the device are not drawn to scale. The device, indicated generally as 1, comprises substrate 3, a first semiconductor layer 5, a second semiconductor layer 7, a third semiconductor layer 9, a fourth semiconductor layer 11, a fifth semiconductor layer 13, and a sixth semiconductor layer 15. Layers 5 and 7 have a first conductivity type and layers 11, 13, and 15 have a second conductivity type. Substrate 3 and layer 15 are heavily doped to form ohmic contacts to the device. Layer 9, which is the active layer, may have either first or second conductivity types and has a bandgap which is less than the bandgaps of layers 7 and 11. Layers 5 and 13 have bandgaps greater than those of layers 7 and 11. In a preferred embodiment, the first conductivity type is n-type and the second conductivity type is p-type. The active layer has a thickness indicated as d. In another embodiment, layers 7, 9 and 11 have the same conductivity type.

Layers 7 and 11 are compositionally varying, i.e., graded to produce a refractive index profile that provides waveguiding action for the optical radiation. The refractive index in the waveguiding layers has a maximum and minimum value with the maximum value being nearer the active layer than is the minimum. The refractive index profile is desirably symmetric with respect to the active layer, i.e., the active layer is positioned symmetrically with respect to layers 7 and 11, and may be described, in a preferred embodiment, by a power law:

$$n(r) = n_y[1 - 2(2r/w)^g\Delta]^{\frac{1}{2}}, r < w/2$$
$$= n_z, r > w/2$$

where R is the distance from the center of the waveguide, g is the exponent of the power law, $\Delta$ is approximately equal to $(n_y-n_z)/n_y$ and $n_y$ and $n_z$ are the maximum and minimum values of the refractive index in the graded layers. The maximum values are nearer the active layer than are the minimum values.

Layer 9 has the composition $Al_xGa_{1-x}As$ while layers 7 and 11 have a composition that is graded from $Al_yGa_{1-y}As$ adjacent to active layer 9 to $Al_zGa_{1-z}As$ adjacent to layers 5 and 13, respectively. Layers 5 and 13 comprise $Al_zGa_{1-z}As$. The conductivity types are indicated.

Figure 2:
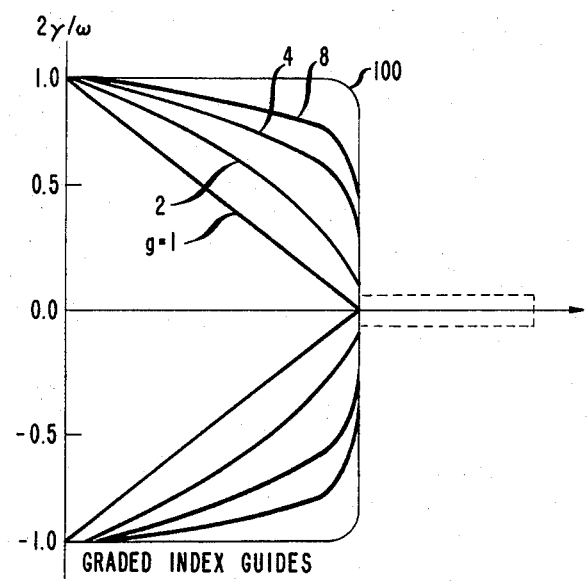
FIG. 2 shows various possible refractive index profiles of the graded layers.

FIG. 2 shows the refractive index profile in the guiding and active layers for several power law exponents. The thicknesses of the layers are not drawn to scale. Distances from the center of the active layer are plotted vertically in units of $\gamma/w$ where w is the optical cavity dimension, and the refractive index is plotted horizontally in arbitrary units. In particular, profiles are shown for g=1, 2, 4, 8, and 100. As can be seen, in the limit of very large g, the refractive index profile approaches that of the regular symmetric separate confinement heterostructure laser described previously, that is, it approaches a step function charge in refractive index at the heterojunctions. It is generally desirable that power law exponents generally be less than 100. Higher values are undesirable because overlap between the optical field and the carriers decreases. In a preferred embodiment, g is equal to 2 and the refractive index profile is parabolic.

Figure 3:
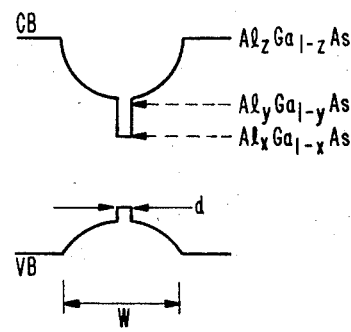
FIG. 3 depicts the energy band diagram of a device according to this invention.

FIG. 3 shows a typical energy band diagram for a device according to my invention. Again, the thicknesses of the layers are not to scale and the compositions vary as previously discussed.

This power law refractive index profile offers several advantages over the regular separate confinement heterostructure. For example, the near field radiation pattern has a significant effect on the shape and divergence of the far field radiation pattern. The power law graded refractive index waveguiding layers permit varying not only the wave propagation characteristics within the device but also permit control of the far field beam distribution. This controls and enables the far field distribution to match, for example, the particular type of optical fiber being used or the imaging optics between the laser and the fiber. Additionally, when the parabolic graded refractive index profile is present, the optical modes that are supported in the direction perpendicular to the junction plane are Hermite-Gaussians. If the active layer is now also made very thin, less than 0.1 $\mu$m, and located at the center of the waveguide, the mode gains, that is, the optical overlap of the mode with the gain region that is the active layer, are significantly smaller for the higher order transverse modes than they are in the regular separate confinement heterostructure lasers. This feature is desirable because it provides additional strong mode discrimination against the higher order transverse modes. It should also be noted that if the device is symmetric about the active region, the gain region is located at the minima of the optical intensity distributions of all odd order transverse modes. This suppresses all odd order modes regardless of the waveguide thickness. Furthermore, if the active layer is located asymmetrically in the waveguide, the cutoff thickness for the first order transverse mode can be increased over that of the regular separate confinement heterostructure lasers.

Devices of my invention are conveniently grown by molecular beam epitaxy. This is an especially desirable growth technique because the composition and thus the refractive index profile may be easily graded by, for example, varying the effusion cell temperatures and very thin and uniform layers may be grown reproducibly. The compositions and thicknesses of the layers may be easily determined by measurement of the growth rates. It is contemplated that effusion cell temperatures may be varied in small, discrete steps. In this case, the power law profile is an excellent approximation of the actual profile.

In one embodiment, the active layer comprises a Group III–V compound semiconductor such as $Al_xGa_{1-x}As$ and the graded refractive index waveguiding layers also comprise a Group III–V compound semiconductor such as $Al_xGa_{1-x}As$. The other layers also comprise a Group III–V compound semiconductor such as $Al_xGa_{1-x}As$. The layers may comprise other semiconductors, for example, Group II–VI compound semiconductors. All layers have compositions that lattice to each other.

Figure 4:
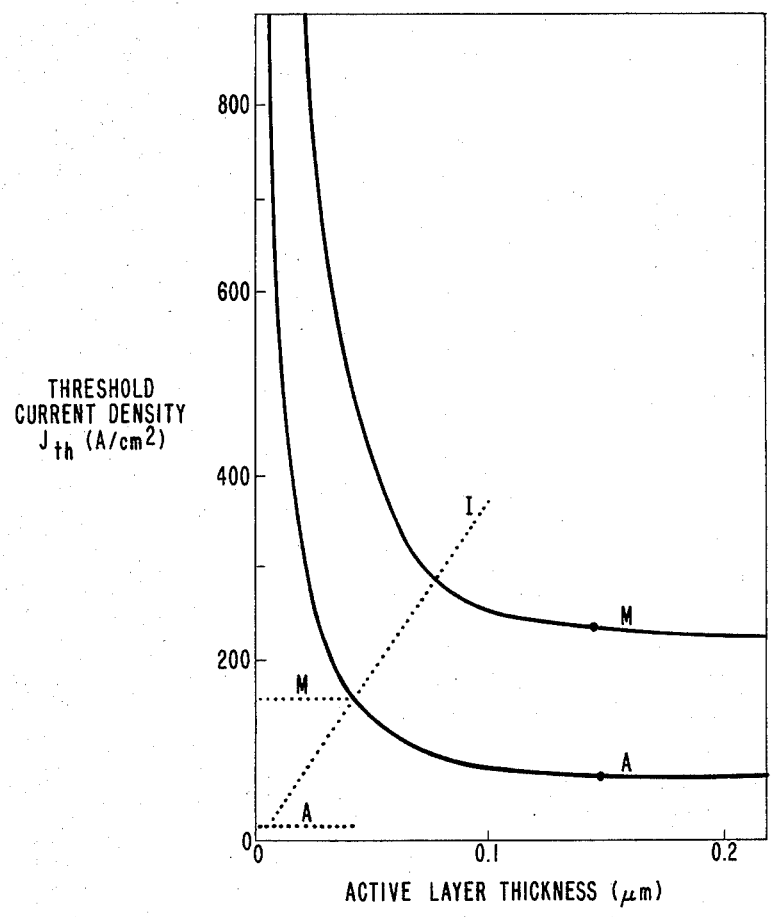
FIG. 4 plots the active layer thickness in units of microns, horizontally, in microns versus the threshold current density in units of $A/cm^2$, vertically.

The low values obtained for the threshold current may be understood from the following conclusions. The threshold current density is due to three terms. The first is an intrinsic term, I, the second is an internal loss term, A, and the third term is a mirror loss term, M. The precise form of each term is well known to those working in the art. The relative importance of these three terms is depicted in FIG. 4 which plots the active layer thickness, horizontally, in microns versus the threshold current density, vertically, in $A/cm^2$. The mirror loss term is indicated as M, and the internal loss term is indicated as A. As can be seen, the threshold current density for both terms rises rapidly as the active layer thickness decreases for the double heterostructure laser as indicated by the solid curves A and M. The intrinsic term decreases with decreasing active layer thickness as is shown by the curve labeled I. The mirror loss term and the internal loss term increase rapidly with the decrease in active layer thickness because optical confinement factor, $\Gamma$, decreases as the active layer of thickness decreases in double heterostructure lasers. However, the graded refractive index waveguiding layers increase $\Gamma$ and as a result, $d/\Gamma$ remains relatively constant in lasers according to my invention in the regime of very thin active layers.

In addition to the increased optical confinement to the active layer in devices according to my invention, which reduces the thresholds, the magnitude of the individual terms contributing to the total threshold current density of the laser can be reduced further by various measures. For example, the mirror loss term may be reduced by having reflective mirror coatings employing single or multiple layers. The intrinsic term can be reduced by increasing the value of $\beta$, the gain constant, and by reducing the active layer thickness below 500 Angstroms. The internal loss term may be reduced by reducing the total free carrier absorption losses encountered by the propagating mode in the structure. The total free carrier absorption losses are given by the sum of the free carrier absorption loss in the thin active layer and that in the graded index waveguide layers and the cladding layers. This is expressed as $\alpha = \Gamma\alpha_1 + (1-\Gamma)\alpha_2$, where $\alpha_1$ is the free carrier absorption loss in the active layer and $\alpha_2$ is that in the waveguide layers and the cladding layers. Again, $\Gamma$ is a factor which relates the overlapping of the optical field with the active layer and $(1-\Gamma)$ relates the overlap outside the active layer in the waveguide and cladding layers. Further, $\alpha_1$ and $\alpha_2$ depend on the free carrier concentrations in the layers by the relationship $(3\times10^{-18}n + 7\times10^{-18}p)$, where n and p are the electron and hole concentrations in the layer, respectively. Therefore, my invention is able to significantly reduce the total free absorption loss $\alpha$ by having the active layer very thin, typically $\leq 700$ Angstroms, and the graded index waveguide layers nominally undoped, i.e., having doping concentrations less than approximately $10^{16}/cm^3$ and the cladding layers only slightly doped, $10^{17}cm^{-3}$. In this manner, even though at threshold both n and p in the thin active layer are $\sim 2\times10^{18}cm^{-3}$, the effective free carrier absorption less $\Gamma\alpha_1$ is still very small, typically $<1cm^{-1}$. This is so because the absolute magnitude of $\Gamma$ is $\sim 0.1$ when d is made $\lesssim 700$ Angstroms in the laser structures according to my invention. This means that most of the optical field is still in the graded index waveguide layer, that is $(1-\Gamma) \sim 0.9$ and very little in the cladding layers. However, because the waveguide layers are undoped and the cladding layers are lowly doped, n and p are low, typically $<10^{16}cm^{-3}$ for the waveguide layers. As a result, the effective loss $(1-\Gamma)\alpha_2$ is very small also, typically $<1cm^{-1}$. Thus, the total loss $\alpha$ is typically only $\lesssim 2cm^{-1}$. This is to compare with typically $10-20cm^{-1}$ in DH lasers.

The optical scattering loss due to irregularities at the heterointerface or within the waveguide region was determined to be negligible because the additional graded index waveguide layers reduce the effects of interface roughness. The coupling loss was negligible because the cladding layers were relatively thick.

Other embodiments are contemplated. For example, the refractive index in the guiding layers may not decrease monotonically from the active layers.

What is claimed is:

1. A semiconductor laser comprising a first semiconductor active layer having a first bandgap, second and third layers having bandgaps larger than said first bandgap, said first layer being between said second and third layers, said second and third layers having a composition varying such that said second and third layers each have a varying refractive index with a maximum and a minimum, said maximum being nearer said first layer than said minimum whereby waveguiding occurs, fourth and fifth semiconductor layers having first and second conductivity types, respectively, and contacting said second and third layers, respectively, said fourth and fifth layers having bandgaps greater than those of said second and third layers, and first and second ohmic contacts to said laser.

2. A device as recited in claim 1 in which said first, second, and third layers have the same conductivity type.

3. A device as recited in claim 1 in which said second and third layers have first and second conductivity types, respectively.

4. A device as recited in claim 1, 2, or 3 in which the refractive index, n, of said second and third layers varies according to:

$$n(r) = n_y[1 - 2(2r/w)^g\Delta]^{\frac{1}{2}}, r < w/2$$
$$= n_2, r > w/2,$$

where r is the distance from the center of this waveguide, g is the exponent of the power law, $\Delta$ is approximately equal to $(n_y-n_z)/n_y$, $n_y$ and $n_z$ are the maximum and minimum values of the refractive index in the graded layers, and w is the optical cavity dimension.

5. A device as recited in claim 4 in which g is less than 100.

6. A device as recited in claim 5 in which g is equal to approximately 2.

7. A device as recited in claim 1, 3, or 4 in which said first, second, and third semiconductor layers comprise at least one semiconductor selected from the group consisting of Group III-V and group II-VI compound semiconductors.

8. A device as recited in claim 7 in which said Group III-V compound semiconductor comprises $Al_xGa_{1-x}As$.

9. A device as recited in claim 1, 2, or 3 in which said first layer has a thickness less than 100 Angstroms.

10. A device as recited in claim 9 in which said first layer is positioned symmetrically with respect to said second and said third layers.

* * * * *